US006433637B1

(12) United States Patent
Sauer (10) Patent No.: US 6,433,637 B1
(45) Date of Patent: Aug. 13, 2002

(54) SINGLE CELL RAIL-TO-RAIL INPUT/OUTPUT OPERATIONAL AMPLIFIER

(75) Inventor: Don R. Sauer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/815,779

(22) Filed: Mar. 23, 2001

(51) Int. Cl.[7] ................................................. H03F 3/45

(52) U.S. Cl. ....................................... 330/255; 330/264

(58) Field of Search ............................... 330/253, 255, 330/264, 263

(56) References Cited

U.S. PATENT DOCUMENTS

| 4,532,479 | A |   | 7/1985  | Blauschild    | 330/261 |
|-----------|---|---|---------|---------------|---------|
| 5,414,388 | A |   | 5/1995  | Sauer         | 330/252 |
| 5,455,535 | A |   | 10/1995 | Sauer         | 327/560 |
| 5,471,172 | A |   | 11/1995 | Chiu et al.   | 330/253 |
| 5,512,848 | A |   | 4/1996  | Yaklin        | 327/65  |
| 5,521,553 | A | * | 5/1996  | Butler        | 330/255 |
| 5,546,045 | A |   | 8/1996  | Sauer         | 327/561 |
| 5,714,906 | A |   | 2/1998  | Motamed et al.| 327/563 |
| 5,729,177 | A |   | 3/1998  | Goutti        | 330/257 |
| 5,907,259 | A | * | 5/1999  | Yamada et al. | 330/255 |
| 5,909,146 | A | * | 6/1999  | Okada         | 330/255 |
| 5,963,085 | A |   | 10/1999 | Sauer         | 330/9   |
| 6,005,440 | A | * | 12/1999 | Okamoto       | 330/253 |
| 6,160,424 | A |   | 12/2000 | Migliavacca   | 327/65  |
| 6,317,000 | B1| * | 11/2001 | Ivanov et al. | 33/255  |

OTHER PUBLICATIONS

Cauwenberghs, Bert, "Lab 4: Subthreshold MOS Charcteristics and Model Parameter Extraction," Feb. 25, 1998 4 pages. downloaded Feb. 23, 2001 from http://bach.ece.jhu.edu/~gert/course.348/lab4/lab4.html.

* cited by examiner

Primary Examiner—Robert Pascal
Assistant Examiner—Khanh Van Nguyen
(74) Attorney, Agent, or Firm—Brett A. Hertzberg; Merchant & Gould P.C.

(57) ABSTRACT

A method and apparatus is directed to a rail-to-rail MOS amplifier that operates with a very low power supply. An input stage amplifier operates over rail-to-rail common-mode voltages. The input stage amplifier includes two differential input stages that steer current to loads in a class AB turnaround stage. The class AB turnaround stage converts the differential signals into a single signal that is driven into an output stage amplifier. The output stage amplifier includes level shifting buffer amplifiers that are arranged to bias a pair of MOS output transistors. Each level shifting buffer amplifier is arranged to bias a MOS transistor in a sub-threshold operating region such that the MOS transistor operates as a resistor. The MOS resistor works in conjunction with a MOS diode to provide an AB bias voltage to a gate of a respective one of the output transistors. The level shifting buffer amplifiers are also arranged such that the gate of each output transistor is selectively switched to a power supply voltage, providing maximum gate drive to the output transistor when the output transistor drives a maximum current to an external load. A single capacitor may be employed to provide compensation between the output of the amplifier and the output of the class AB turnaround stage. The sub-threshold operation of the level shifting buffer amplifiers permits the output stage amplifier to operate on power supplies down to roughly a single transistor threshold voltage.

21 Claims, 5 Drawing Sheets

SINGLE CELL RAIL-TO-RAIL INPUT/OUTPUT OPERATIONAL AMPLIFIER

FIELD OF THE INVENTION

The present invention relates to an operational amplifier that operates at low power-supply voltages. In particular, the present invention relates to a method and apparatus that includes a rail-to-rail input trans-conductance stage that supplies a current output to an output trans-conductance stage. The input and output stages operate over the full power supply range.

BACKGROUND OF THE INVENTION

Differential amplifiers normal only operate over a limited range of input voltages. The maximum input voltage range for which a circuit continues to operate as an amplifier is termed the input common-mode range (CMR). When the input voltages (or common mode voltage) exceed the input CMR, transistors become cutoff, saturated, or breakdown in one or more gain stages of the amplifier. Typically, the CMR permits the common mode voltage ($V_{CM}$) to approach within a few volts of either power supply voltage before the amplifier performance is degraded.

Figure 5:
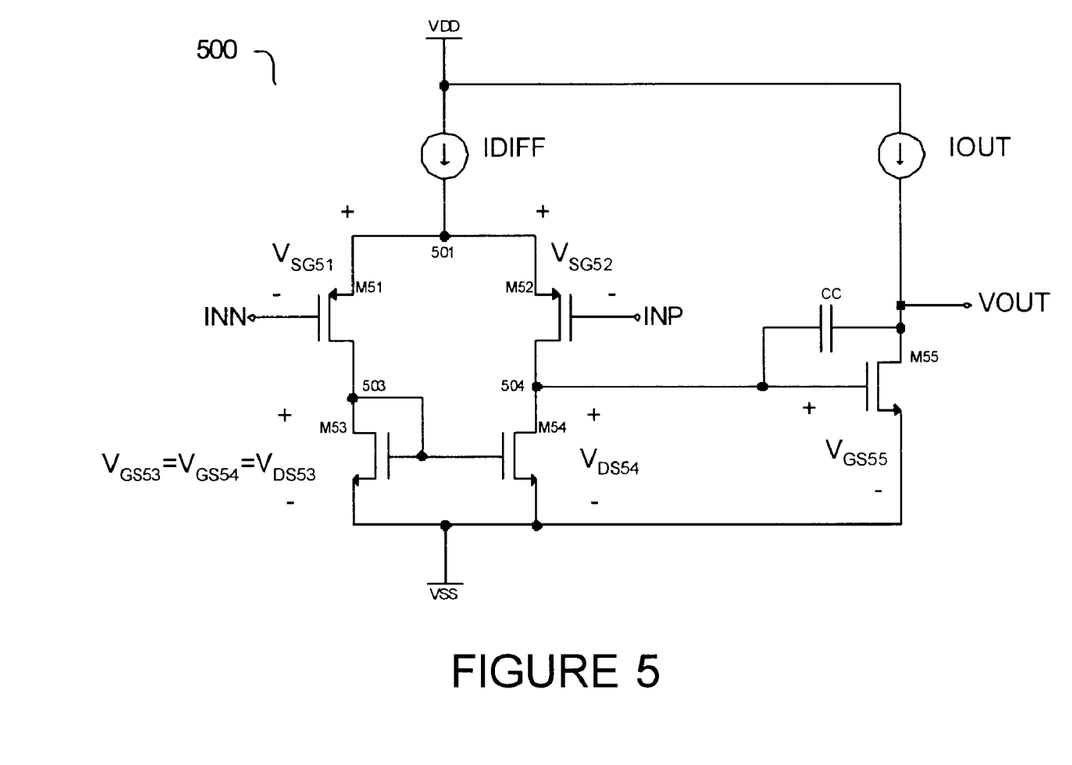
FIG. 5 is a schematic diagram of a simple operational amplifier.

A simple differential amplifier (500) is shown in FIG. 5. As shown in the figure, a current source (IDIFF) sources a current into node 501. Transistor M51 has a source connected to node 501, a gate connected to an inverting input terminal (INN), and a drain connected to node 503. Transistor M52 has a source connected to node 501, a gate connected to a non-inverting input terminal (INP), and a drain connected to node 504. Transistor M53 is a diode-connected transistor with a gate and drain connected to node 503, and a source connected to VSS. Transistor M54 has a gate connected to node 503, a drain connected to node 504, and a source connected to VSS. Transistor M55 has a gate connected to node 504, a drain connected to an output terminal (VOUT), and a source connected to VSS. A second current source (IOUT) sources a current into the drain of transistor M55 ($V_{OUT}$). A capacitor (CC) is connected between VOUT and node 103.

Transistors M51 and M52 are a matched pair of PMOS transistors that form a differential input stage of the differential amplifier (500). Transistors M53 and M54 form an NMOS current mirror, acting as a load for the differential input pair (M51, M52). Current source IDIFF supplies a "tail current" to bias the differential input pair transistors into their active region of operation. NMOS transistor M55 serves as an amplifier, with an input at node 504 and an output at VOUT. The capacitor (CC) reduces the gain of the amplifier at high frequencies to provide a stable amplifier by Miller compensation.

The input differential pair transistors (M51, M52) limit the CMR of differential amplifier 500. Transistors M51 and M52 must be biased in saturation for the amplifier to function properly. A typical threshold voltage of a PMOS transistor ($V_{TP}$) is on the order of -1V. To remain in saturation, the source-to-gate voltage ($V_{SG}$) of transistors M51 and M52 must be biased active ($V_{SG} \geq |V_{TP}|$) Since the input differential pair transistors will be cutoff when $V_{CM}$ (the DC level at INM and INP) approaches the $V_{DD}$ power supply, the input differential pair transistors will operate as an amplifier when: $V_{G51}(max)=V_{G52}(max)=V_{CM}(max) \leq V_{DD}-|V_{TP}|$. The active load transistors (M53, M54), together with the input differential pair transistors (M51, M52) determine the minimum $V_{CM}$ for which the amplifier will operate properly. Transistors M51 and M52 must also have a source-to-drain voltage ($V_{SD}$) that exceeds the saturation voltage ($V_{SD} \geq V_{SG}-|V_{TP}|$). The typical threshold voltage of a NMOS transistor ($V_{TN}$) is on the order of +1V. The load transistors M53, M54 must be biased active ($V_{GS53}=V_{GS54}>V_{TN}$). The minimum $V_{CM}$ for amplifier 500, is determined by: $V_{G51}(min)=V_{G52}(min)=V_{CM}(min) \geq V_{SS}+V_{TN}-|V_{TP}|$. Thus, amplifier 500 does not operate as a rail-to-rail amplifier.

The open loop gain of the amplifier (Av) is determined by the transconductance of transistors M52 and M55. The open loop gain of the amplifier (500) is on the order of 60 dB. The capacitor (CC) creates a dominant pole in the amplifier (500) such that the gain of the amplifier is reduced at high frequency. The unity-gain bandwidth (GBW) of the amplifier (500) is defined as the frequency where the gain drops from the open loop gain down to 0 dB. Since $C_C$ creates a dominant pole in the amplifier, the unity gain bandwidth (GBW) is proportional to $g_m/C_C$, where $g_m$ is the transconductance of the amplifier.

SUMMARY OF THE INVENTION

In accordance with the invention, the above and other problems are solved by an apparatus and method that is directed to an amplifier with a rail-to-rail output swing that operates on a very low power supply voltage.

Briefly stated, the present invention relates to a method and apparatus that is directed to a rail-to-rail MOS amplifier that operates with a very low power supply. An input stage amplifier operates over rail-to-rail common-mode voltages. The input stage amplifier includes two differential input stages that steer current to loads in a class AB turnaround stage. The class AB turnaround stage converts the differential signals into a single signal that is driven into an output stage amplifier. The output stage amplifier includes level shifting buffer amplifiers that are arranged to bias a pair of MOS output transistors. Each level shifting buffer amplifier is arranged to bias a MOS transistor in a sub-threshold operating region such that the MOS transistor operates as a resistor. The MOS resistor works in conjunction with a MOS diode to provide an AB bias voltage to a gate of a respective one of the output transistors. The level shifting buffer amplifiers are also arranged such that the gate of each output transistor is selectively switched to a power supply voltage, providing maximum gate drive to the output transistor when the output transistor drives a maximum current to an external load. A single capacitor may be employed to provide compensation between the output of the amplifier and the output of the class AB turnaround stage. The sub-threshold operation of the level shifting buffer amplifiers permits the output stage amplifier to operate on power supplies down to roughly a single transistor threshold voltage.

According to a feature of the invention, a rail-to-rail output swing is achieved with a pair of MOS output transistors and a pair of corresponding drive level shifters that bias the output transistors for class AB operation and provide a maximum drive to the output transistors. In one example, the drive level shifters each include a sub-threshold biased MOS transistor operating as a resistive device that is used to generate an AB bias to one of the MOS output transistors.

According to another feature of the invention, drive level shifters in an output stage amplifier drive the gates of MOS output transistors over a maximum swing level such that maximum output current is available to an external load. In one example, the drive level shifters provide maximum gate drive to the MOS output transistors by coupling the gate to one of the power supply voltages.

According to still another feature of the invention, a single compensation capacitor provides high frequency compensation to an output stage amplifier that has a rail-to-rail output swing.

An embodiment of the invention is directed to an apparatus, operating from a high power supply having a high potential and a low power supply having a low potential, that is arranged to provide a rail-to-rail output signal at an output node in response to an input signal at an input node. The apparatus includes a first active load device, that operates as a sub-threshold device, is coupled to the high power supply and a first intermediary node. A first diode device is coupled between the first intermediary node and a first drive node, wherein the first diode device is arranged to provide a high drive signal at the first drive node when active and the first diode device is inactive when the input signal is at the low potential. A first MOS transistor, wherein the gate of the first MOS transistor is coupled to a reference voltage, the drain of the first MOS transistor is coupled to the first drive node, and the source of the first MOS transistor is coupled to a first current source, wherein the first MOS transistor is arranged to couple the first drive node to the low potential when the first diode device is inactive. A second active load device, that operates as a sub-threshold device, is coupled to the low power supply and a second intermediary node. A second diode device is coupled between the second intermediary node and a second drive node, wherein the diode device is arranged to provide a low drive signal at the second drive node when active and the second diode device is inactive when the input signal is at the high potential. A second MOS transistor, wherein the gate of the second MOS transistor is coupled to the reference voltage, the drain of the second MOS transistor is coupled to the first drive node, and the source of the second MOS transistor is coupled to a second current source, wherein the second MOS transistor is arranged to couple the second drive node to the high potential when the second diode device is inactive. A class AB output drive circuit is arranged to provide the rail-to-rail output signal in response to the high drive signal and the low drive signal, wherein the class AB output drive circuit is biased for class AB operation.

Another embodiment of the invention is directed to an apparatus, operating from a high power supply having a high potential and a low power supply having a low potential, that is arranged to provide a rail-to-rail output signal at an output node in response to a differential input signal. The apparatus includes an input stage amplifier circuit that produces a single-ended signal from the differential input signal, and an output stage amplifier circuit that produces the rail-to-rail output signal in response to the single-ended input signal. The output stage amplifier circuit includes a first active load device, that operates as a sub-threshold device, is coupled to the high power supply and a first intermediary node. A first diode device is coupled between the first intermediary node and a first drive node, wherein the first diode device is arranged to provide a high drive signal at the first drive node when active and the first diode device is inactive when the single-ended input signal is at the low potential. A first MOS transistor, wherein the gate of the first MOS transistor is coupled to the reference circuit, the drain of the first MOS transistor is coupled to the first drive node, and the source of the first MOS transistor is coupled to a first current source, wherein the first MOS transistor is arranged to couple the first drive node to the low potential when the first diode device is inactive. A second active load device, that operates as a sub-threshold device, is coupled to the low power supply and a second intermediary node. A second diode device is coupled between the second intermediary node and a second drive node, wherein the diode device is arranged to provide a low drive signal at the second drive node when active and the second diode device is inactive when the single-ended input signal is at the high potential. A second MOS transistor, wherein the gate of the second MOS transistor is coupled to the reference circuit, the drain of the second MOS transistor is coupled to the first drive node, and the source of the second MOS transistor is coupled to a second current source, wherein the second MOS transistor is arranged to couple the second drive node to the high potential when the second diode device is inactive. A class AB output drive circuit is arranged to provide the rail-to-rail output signal in response to the high drive signal and the low drive signal, wherein the class AB output drive circuit is biased for class AB operation.

Another embodiment of the invention is directed to an apparatus, operating from a high power supply having a high potential and a low power supply having a low potential, that is arranged to provide a rail-to-rail output signal at an output node in response to an input signal at an input node. The apparatus includes a first means for level shifting that produces a first drive signal that corresponds to a first level shifted version of the input signal, the first means for level shifting providing gain between the input signal and the first drive signal, and the first means for level shifting is arranged to couple the first drive signal to the low potential when the potential of the input signal corresponds to the low potential. A second means for level shifting that produces a second drive signal that corresponds to a second level shifted version of the input signal, the second means for level shifting providing gain between the input signal and the second drive signal, and the second means for level shifting is arranged to couple the second drive signal to the high potential when the potential of the input signal corresponds to the high potential. A first output drive means is coupled to the output node, wherein the first output drive means is responsive to the first drive signal.

A second output drive means is coupled to the output node, wherein the second output drive means is responsive to the second drive signal, the first output drive means is arranged to cooperate with the second output drive means such that the first output drive means and the second output drive means provide the rail-to-rail output signal at the output node.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediate devices. The term "coupled" means either a direct electrical connection between the things that are connected, or an indirect connection through one or more passive or active intermediary devices.

The present invention relates to operational amplifiers that provide rail-to-rail performance in both input and output characteristics of the operational amplifier. The operational amplifier may operate in applications that require very low power supplies (e.g. 1V) such as in battery-powered applications. The operational amplifier includes two transconductance stages to provide rail-to-rail input and output (RRIO) performance. The input stage of the amplifier includes two rail-to-rail (RR) inputs and a single current output. The input stage transistors include differential pairs that may be operated in their sub-threshold operating condition for low power supplies.

Figure 1:
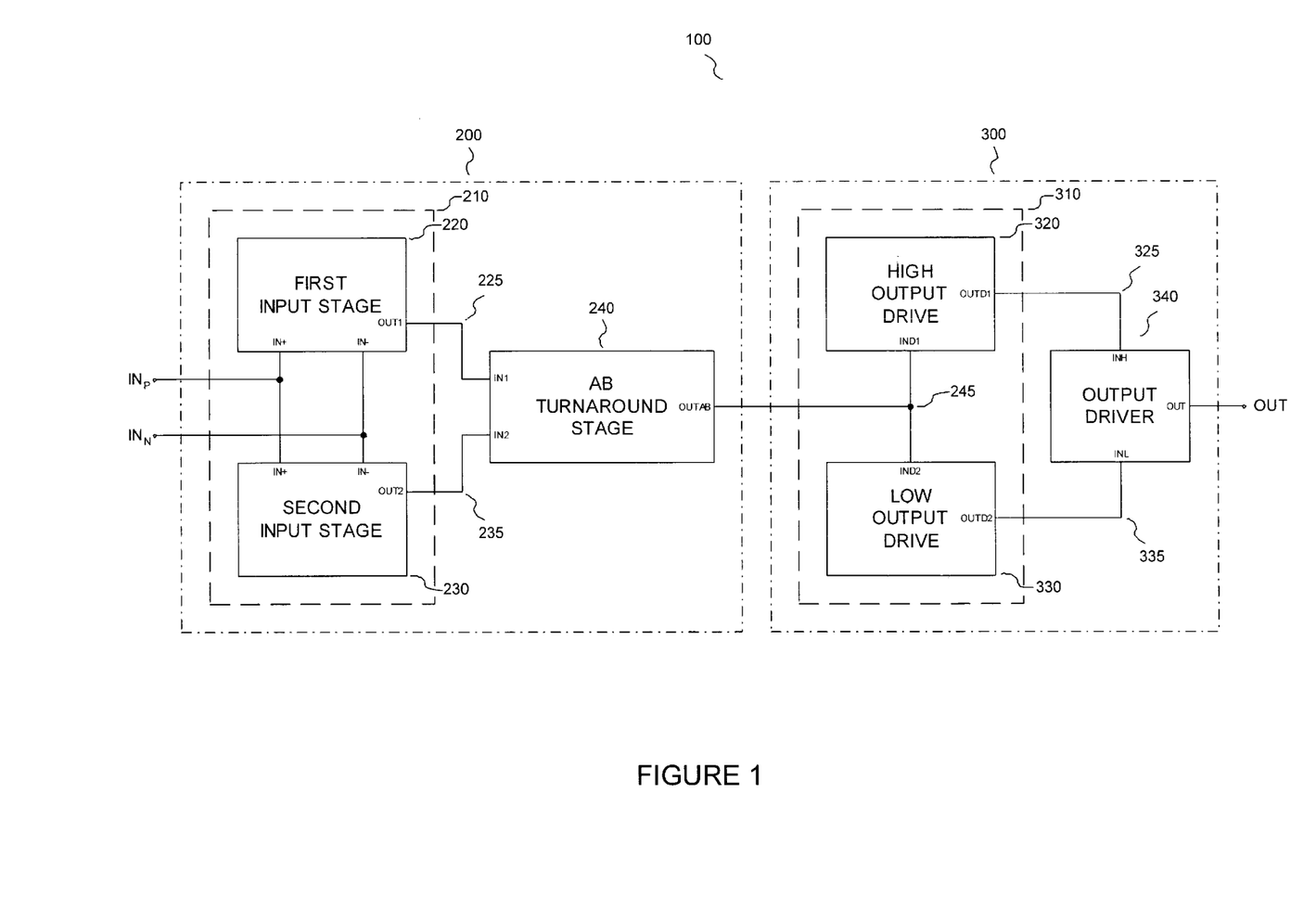
FIG. 1 is a schematic diagram of a rail-to-rail input/output amplifier system in accordance with the present invention.

FIG. 1 shows a schematic of an exemplary rail-to-rail amplifier that is in accordance with the present invention. The amplifier (100) includes an input stage amplifier (200) and an output stage amplifier (300). The input stage amplifier (200) includes an input stage (210) and an AB turnaround stage (240). The output stage amplifier (300) includes a pre-driver (310) and an output driver (340).

The input stage amplifier receives a differential input signal (INP, INN) and produces two output signals (225, 235). The input stage (210) is implemented as two input stages (220, 230). The first input stage (220) includes a differential pair of transistors of a first type (e.g., NMOS), while the second input stage (230) includes a differential pair of transistors of a second type (e.g., PMOS). The first input stage (220) produces the first output signal (225) in response to the differential input signal (INP, INN). The second input stage (230) produces the second output signal (235) in response to the differential input signal (INP, INN). The output signals (225, 235) are combined by the AB turnaround stage (240) to produce a first amplified signal (OUTAB, 245).

The pre-driver (310) receives the first amplified signal (245) and produces two output signals (325, 335). The pre-driver (310) in the output stage amplifier (300) includes two drive blocks (320, 330). The first drive block (320) is a high output drive block that receives the first amplified signal (245) and produces the first (high) output driver signal (325). The second drive block (330) is a low output drive block that receives the first amplified signal (245) and produces the second (low) output driver signal (335). The output signals (325, 335) are combined by the output driver (340) to produce a second amplified signal (OUT).

Figure 2:
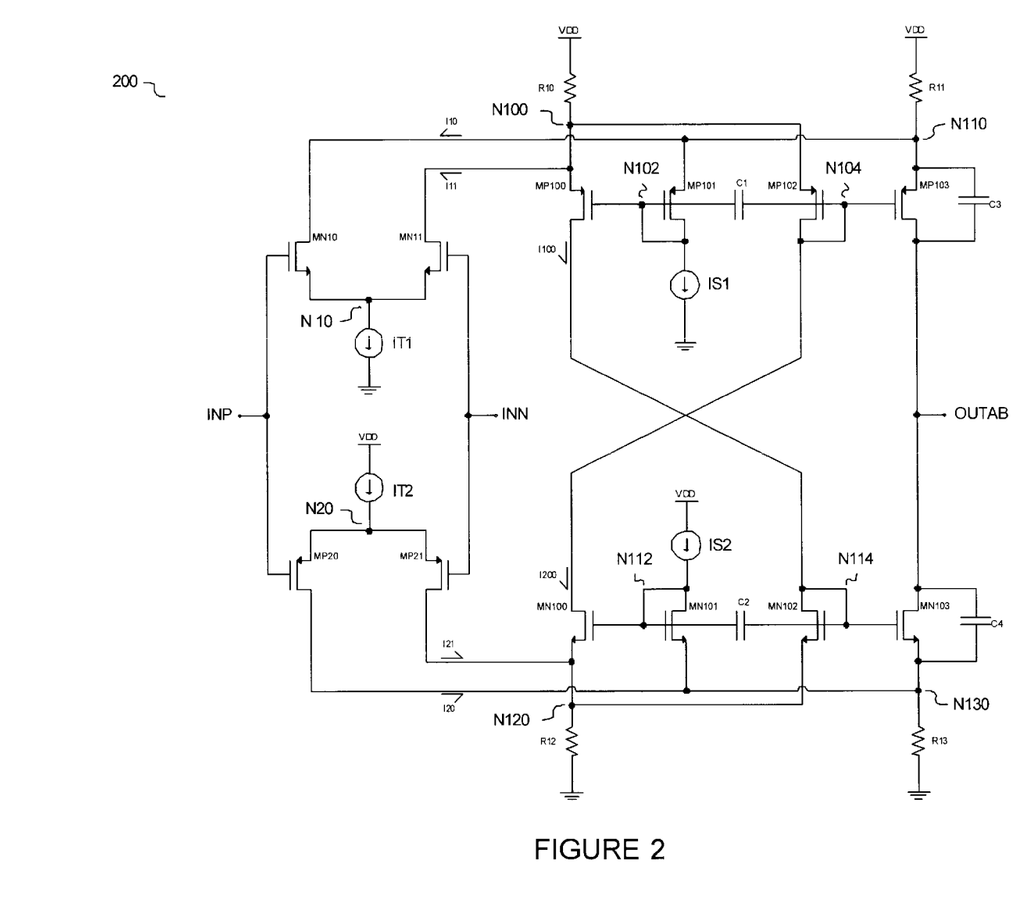
FIG. 2 is a schematic diagram of an exemplary input stage amplifier for the amplifier system shown in FIG. 1 in accordance with the present invention.

An exemplary input stage amplifier (200) that is in accordance with the present invention is shown in FIG. 2. The input stage amplifier (200) includes an NMOS input stage with a differential pair of transistors (MN10, MN11) and a current source IT1. The gate of transistor MN10 is connected to a non-inverting input terminal (INP), while the gate of transistor MN11 is connected to an inverting input terminal (INN). The drain of transistor MN10 is connected to node N110. The drain of transistor MN11 is connected to node N100. The sources of transistors MN10 and MN11 are connected to a common node (N10). The current source (IT1) is series connected between node N10 and a circuit ground potential (GND).

The input stage amplifier (200) also includes a PMOS input stage with a differential pair of transistors (MP20, MP21) and another current source IT2. The gate of transistor MP20 is connected to the non-inverting input terminal (INP), while the gate of transistor MP21 is connected to the inverting input terminal (INN). The drain of transistor MP20 is connected to node N130, while the drain of transistor MP21 is connected to node N120. The source of transistor MP20 and MP21 are connected to another common node (N20). The other current source (IT2) is series connected between a circuit high power supply potential (VDD) and the other common node (N20).

The input stage amplifier (200) further includes an AB turnaround stage with four resistors (R10–R13), four PMOS transistors (MP100–MP103), four NMOS transistors (MN100–MN103), two current sources (IS1, IS2), and four capacitors (C1–C4).

Resistor R10 is series connected between node N100 and the circuit high power supply potential (VDD). Resistor R11 is series connected between node N110 and the circuit high power supply potential (VDD). Resistor R12 is series connected between node N120 and the circuit ground potential (GND). Resistor R13 is series connected between node N130 and the circuit ground (GND). Capacitor C1 is connected between node N102 and node N104. Capacitor C2 is connected between node N112 and node N114. Capacitor C3 is connected between node N110 and an output node (OUTAB). Capacitor C4 is connected between node N130 and the output node (OUTAB). One of the current sources (IS1) is connected between node N102 and the circuit ground potential (GND), while the other current source (IS2) is connected between the circuit high power supply potential (VDD) and node N112.

Transistor MP100 has a source connected to node N100, a gate connected to node N102, and a drain connected to node N114. Transistor MP101 has a source connected to node N110, and a gate and drain connected to node N102. Transistor MP102 has a source connected to node N100, and a gate and drain connected to node N104. Transistor MP103 has a source connected to node N110, a gate connected to node N104, and a drain connected to the output node (OUTAB). Transistor MN100 has a source connected to node N120, a gate connected to node N112, and a drain connected to node N104. Transistor MN101 has a source connected to node N130, and a gate and drain connected to node N112. Transistor MN102 has a source connected to node N120, and a gate and drain connected to node N114. Transistor MN103 has a source connected to node N130, a gate connected to node N114 and a drain connected to the output node (OUTAB).

Transistor MP101 is configured as a diode in series with current source IS1, which together provide a bias potential for the gate of transistor MP100 at node N102. Similarly, transistor MN101 is configured as a diode in series with current source IS2, which together provide a bias potential for the gate of transistor M100 at node N112, Transistor MP100 conducts a current (I100) that is controlled by the bias potential at node N102 and the potential of node N100. Transistor MN100 conducts another current (I200) that is controlled by the bias potential at node N112 and the potential of node N110. Since transistors MP100 and MP102 share a common source connection to node N100, currents I100 and I200 both flow through resistor R10. Similarly, transistors MN100 and MN102 share a common source connection to node N120, resulting in currents I100 and I110 flowing through resistor R12.

Transistors MP100 and MP101 are sized and arranged in a first ratio, while transistors MN100 and MN101 are sized and arranged in a second ratio. Transistors MP102 and MP103 are also arranged in the first ratio, while transistors MN102 and MN103 are arranged in the second ratio. Resistors R10 and R11 are approximately equal to one another. Resistors R12 and R13 are also approximately equal to one another. When an input signal applied to the INP and INN terminals have no difference, the currents flowing through resistors R10 and R11 are equal to one another, and the currents flowing through resistors R12 and R13 are equal to one another. In one embodiment of the invention, the first and second ratios are 1:1.

Current sources IT1 and IT2 provide for a first set of matched currents that flow in opposite directions. Current sources IS1 and IS2 provide for a second set of matched currents that flow in opposite directions. Current sources IS1 and IS2 are arranged such that they supply much less current than the current sources IT1 and IT2. In one example of the present invention, current sources IT1 and IT2 provide for 4 times the current of the current sources IS1 and IS2 (i.e., IT1=IT2=2 $\mu$A, IS1=IS2=½ $\mu$A). The differences in the current in the input stages (MN10, MN11, IT1; MP20, MP21, IT2) and the AB turnaround stage results in improved offset performance in the amplifier (100). Since the current in the input stage is greater than the current in the AB turnaround stage, the offset of the amplifier is dominated by the offsets that are caused in the input stage. In one example of the present invention, offsets in the input stage affect the overall offset in the amplifier five times more than offsets in the AB turnaround stage. Additionally, noise performance in the input stage is dominated by the size of the input transistors (MN10, MN11, MP20, MP21).

The input stage amplifier (200) shown in FIG. 2 has three common-mode operating ranges. The first operating range (lower range) is for common-mode inputs between the circuit ground potential (GND) and a threshold potential of the NMOS differential pair of transistors (MN10, MN11). The second operating range (middle range) is for common-mode inputs between the threshold potential of the NMOS differential pair of transistors (MN10, MN11) and the threshold potential of the PMOS differential pair of transistors (MP20, MP21). The third operating range (upper range) is for common-mode inputs between the threshold potential of the PMOS differential pair of transistors (MP20, MP21) and the circuit high power supply potential (VDD).

Transistor MN10 conducts a first current (I10) when the potential at the non-inverting input terminal (INP) is sufficient to activate the transistor. Transistor MNI I conducts a second current (I11) when the potential at the inverting input terminal (INN) is sufficient to activate the transistor. Similarly, transistors MP20 and MP2 1 conduct currents I20 and I21 respectively when the potentials at the non-inverting input terminal (INP) and the inventing input terminal (INN) are sufficient to activate the transistors. When active, the sum of currents I10 and Ill is approximately equal (ignoring non-ideal effects) to the tail current produced by current source IT1, and the sum of currents I20 and I21 is approximately equal to the tail current produced by current source IT2.

The input transistors (MN10, MN11, MP20, MP21) amplify the differential input signal that is applied across the INP and INN terminals. Resistors R10 and R11 act as loads, generating gain for the NMOS input stage (MN10, MN11), while resistors R12 and R13 act as loads, generating gain for the PMOS input stage (MP20, MP21, IS2). The AB turnaround stage also generates gain, summing currents at the output node (OUTAB). The NMOS input stage (MN10, MN11, IT1) operates for common-mode input signals above the circuit ground by one threshold potential, while the PMOS input stage (MP20, MP21, IT2) operates over common-mode input signals that are below the high power supply potential (VDD) by a threshold potential. Together the NMOS and PMOS input stage permit the input signal (INP, INN) to operate over common-mode voltages between the positive power supply potential (VDD) and the circuit ground potential (GND).

Capacitors C1 and C2 are arranged in a common gate drive arrangement. The arrangement reduces overall gain in the AB turnaround stage and reduces phase delay. Capacitor C3 and C4 are feed-forward capacitors that bypass the gain of the output transistors (MP103, MN103) at high frequencies. The arrangement of capacitors C1–C4 reduces gain from the input stage amplifier (200) at high frequencies by bypassing the gain in the AB turnaround stage. Notice that the differential input signal is coupled through transistors MN10 and MP20 directly to resistors R11 and R13 respectively, and that the capacitors C3 and C4 couple the signal from nodes N110 and N130 to the output node (OUT).

In one example, a differential input signal is applied to the INP and INN terminals that have a common-mode voltage in the upper range described above. In this case, transistors MN10 and MN11 are both active, while transistors MP20 and MP21 have insufficient biasing voltage to become active (I20=I21=0). When no difference exists between the potential at the INP and INN terminals, current I10 approximately equals current I11, and the current through resistor R10 is equal to the current through resistor R11 (I100=I200). Since the gate-to-source voltage (VGS) of MP100 and MP101 are the same, current I100 will be a ratio of the current IS1. Similarly the VGS of MN101 and MN100 are the same, and current I200 will be a ratio of the current IS2. The total current through resistor R10 is approximately the sum of I100, I200 and I1, while the total current through resistor R12 is approximately the sum of I100 and I200. Similarly, the total current through resistor R11 is approximately the sum of I10, IS1, and the current through transistor MP103 (i.e., I200), while the total current through resistor R13 is approximately the sum of IS2 and the total current through transistor MN103. When transistors MP100 and MP103 are sized appropriately and biased at approximately the same point, transistor MP103 will conduct a current that is approximately equal to I100.

In another example, a differential input signal in the upper range is applied across the INP and INN terminals, where the INP terminal is at a higher potential than the INN terminal. Transistor MN10 will conduct a current (I10) that is greater than the current (I11) through transistor N11. Since the current supplied to transistor MN10 flows through resistor R11, resistor R11 will have a greater voltage drop across it than resistor R10, and the potential of node N100 will be higher than the potential of node N110. Since transistor MP101 is configured as a diode connected device with a source terminal connected to node N110, transistor MP100 is biased to conduct a current (I100) that is greater than the current (IS1) through MP102. Since transistors MP20 and MP21 are inactive, the potential at nodes N120 and N130 are roughly the same. Since the potential of nodes N120 and N130 are roughly the same, current I200 is roughly the same as current IS2. When IS1 and IS2 are equal, the current (I100) flowing through diode-connected transistor MN102 is greater than the current (I200) flowing through transistor MP102. Transistor MN103 will be active and conduct a current equal to I100, while MP103 will conduct a current I200 that is less than IS1. The end result in the struggle between MP103 and MN103 is that MN103 sinks more current than is supplied by MP103 causing the potential of the OUTAB terminal to decrease towards the circuit ground potential. Thus, the input stage tr1154541 ansistors (MN10, MN11) operate as a transconductance amplifier converting the differential input signal to applied to the INP and INN terminals to a single output current flowing through transistors MP103 and MN103.

Operation of the input stage amplifier (200) for common-mode voltages in the lower range is similar to the above discussion. However, in this example transistors MN10 and MN11 are inactive (I10=I11=0), and transistors MP20 and MP21 are active. Operation of the input stage amplifier (200) for common-mode input voltage in the middle range is similarly understood through superposition.

For low voltage application such as battery-powered operation, the input stage transistors (MN10, MN11, MP20, MP21) are designed to operate in their sub-threshold operating region with very low threshold voltages (e.g., 0.5V). For sub-threshold operation, the input transistors are large resulting in an input stage amplifier with a corresponding gm (transconductance) that is proportional to KT/q (K=Boltzman's constant, T is temperature in degrees Kelvin, and q is the magnitude of electronic charge).

Rail-to-rail operation of the input stage amplifier (200) is possible for power supplies that are in the range of roughly 2 threshold potentials. For example, when the low power supply is ground, the threshold voltage of for the PMOS input transistor (e.g., MP20) is −0.5, and the threshold voltage for the NMOS input transistor (e.g., MN10) is 0.4, the high power supply should be around 0.9 volts or greater for rail-to-rail operation of the input stage. However, the amplifier will continue to operate for voltages that are below the PMOS and NMOS threshold voltages. When the power supply potentials become lower than the two threshold voltages, common-mode voltages in the middle range (e.g., 0.4V) will not provide very good performance since the transistors in the two differential stages are not strongly biased. In some application, such as where the input signal is used to sense a power supply voltage, the amplifier has adequate gain for operation at power supply voltages that are very low (e.g. substantially less than two threshold potentials).

Figure 3:
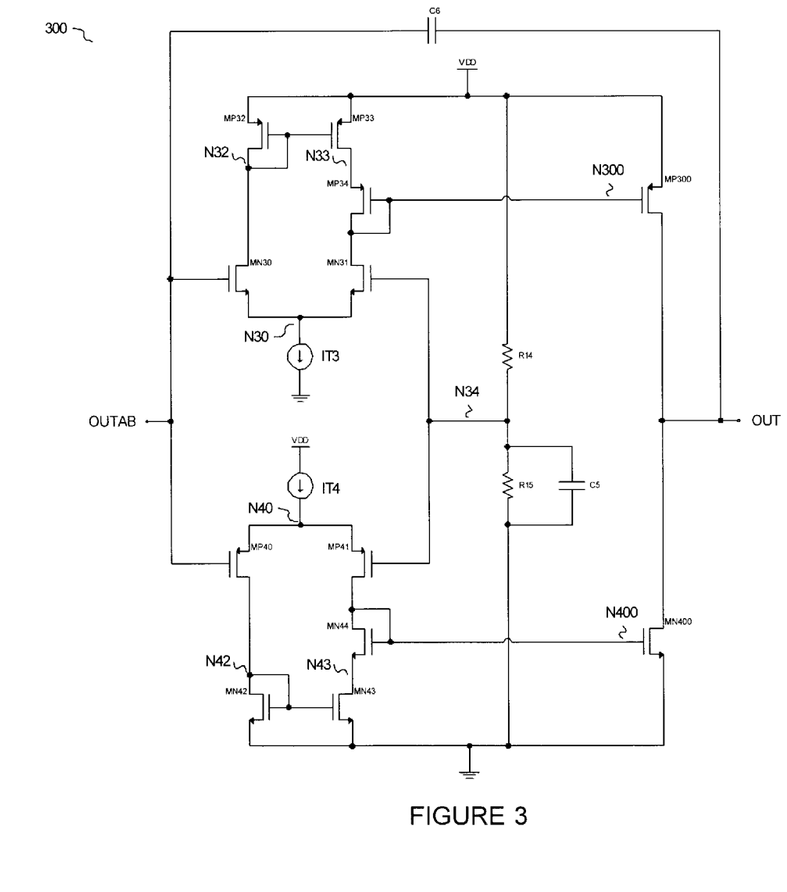
FIG. 3 is a schematic diagram of an exemplary output stage amplifier for the amplifier system shown in FIG. 1 in accordance with the present invention.

FIG. 3 shows a schematic of an exemplary rail-to-rail output amplifier (300) that is in accordance with the present invention. The output amplifier includes a first driver circuit, a second driver circuit, a voltage reference circuit, a pair of output transistors, and a compensation capacitor.

The first driver circuit (high output drive) includes two NMOS transistors (MN30, MN31), three PMOS transistors (MP32, MP33, MP34), and a current source (IT3). NMOS transistors MN30 and MN31 are arranged as a differential pair with common sources connected to node N30. The current source (IT3) is connected to node N30, and operates as a tail current for the differential pair. The drain of transistor MN30 is connected to node N32, while the drain of transistor MN31 is connected to node N300. The gate of transistor MN30 is connected to the OUTAB terminal from FIG. 2, while the gate of transistor MN31 is connected to a reference potential at node N34. PMOS transistor MP32 is configured as a diode with a gate and drain connected to node N32, and a source connected to the high power supply potential (VDD). PMOS transistor MP33 is configured as an active load device with a drain connected to node N33, a gate connected to node N32, and a source connected to the high power supply potential (VDD). PMOS transistor MP34 is configured as a diode, with a gate and drain connected to node N300, and a source connected to node N33.

The second driver circuit (low output drive) includes wo PMOS transistors (P40, MP41), three NMOS transistors (MN42, MN43, MN44), and a current source (IT4). PMOS transistors MP40 and MP41 are arranged as a differential pair with common sources connected to node N40. The current source (IT4) is connected to node N40, and operates as a tail current for the differential pair. The drain of transistor MP40 is connected to node N42, while the drain of Resistor MP41 is connected to node N400. The gate of transistor MP40 is connected to the OUTAB terminal from FIG. 2, while the gate of transistor MP41 is connected to the reference potential at node N34. NMOS transistor MN42 is a configured as a diode with a gate and drain connected to node N42, and a source connected to the circuit ground potential (OND). NMOS transistor MN43 is configured as an active load device with a drain connected to node N43, a ate connected to node N42, and a source connected to the circuit ground potential (GND). NMOS transistor MN44 is a configured as a diode, with a gate and drain connected to node N400, and a source connected to node N43.

A first resistor (R14) is connected between the high power supply potential (VDD) and the reference potential node (N34). A second resistor (R15) is series connected between the reference potential node (N34) and the circuit ground potential (GND). Resistors R14 and R15 together comprise a voltage divide that produces a reference potential at node N34. When resistor R14 and R15 are equal, the reference potential at node N34 is midway between the high power supply node (VDD) and the circuit ground potential (GND). A capacitor may optionally be coupled between the reference potential node N34 and the circuit ground potential (GND) to decouple noise and/or smooth out the reference potential at node N34. It is understood and appreciated that other reference voltage generators may replace the resistor divider formed by resistors R14 and R15. For example, stacked transistors that are arranged to operate as resistors may replace resistors R14 and R15. Also, other potentials may be used as the reference potential at node N34 as may be desired.

A PMOS output transistor (MP300) and an NMOS output transistor (MN400) have drains connected to the output of the amplifier (OUT). PMOS output transistor MP300 has a gate connected to node N300 and a source connected to the high power supply potential (VDD). NMOS output transistor MN400 has a gate connected to node N400 and a source connected to the circuit ground potential (GND). A compensation capacitor (C6) is connected between the OUTAB terminal and the OUT terminal.

The output stage (300) is essentially a transconductance amplifier that produces an output signal at the OUT terminal in response to a single input signal that is provided to the OUTAB terminal. The first driver circuit is a simple amplifier cell that drives an input signal to the gate of the PMOS transistor, while the second driver circuit is another simple amplifier cell that drives another input signal to the gate of the NMOS transistor.

The output drivers provide two functions. First, the output drivers couple the input signal (the output stage amplifier input) from the OUTAB node to the gate of the output devices (MP300, MN400). Second, the output drivers provide an appropriate bias potential to the output devices (MP300, MN400), such that output stage amplifier operates as a class AB amplifier. For proper class AB operation, the output transistors must be biased at appropriate gate voltages. Thus, the output drivers also operate as level shifters, level shifting the signal at the OUTAB node to the appropriate level for class AB operation. When appropriately biased by the level shifters (output drivers), the output transistors (MP300, MN400) have a nominal standby current.

The level shifters (output drivers) are arranged such that the output transistors (MP300, MN400) provide a fill swing (rail-to-rail) output signal at the output node (OUT). For example, connecting the OUTAB terminal to ground results in the gate of transistor MP300 being drawn to ground, while connecting the OUTAB terminal to VDD results in the gate of transistor MN400 being drawn to VDD. The short circuit currents in tie output transistors (MN400, MP300) are determined by the size of the output transistors.

When the OUTAB terminal is at the same potential as the high power supply (VDD), transistor MP40 is turned off. Since MP40 is off, no current flows through transistor MN42. The gates of transistors MN42 and MN43 have the same potential, and hence transistors MN43 and MN44 cannot be on. However, transistor MP41 is biased active by the gate voltage provided at node N34. Transistor MP41 and current source IT4 act as a switch to the high power supply potential (VDD) and node N400 is drawn to the high power supply potential (VDD) through transistor MP41 and current source IT4, providing a full high supply potential (VDD) to the gate of transistor MN400 at node N400. Similarly, when the potential at the OUTAB node is at the same potential as the circuit ground potential (GND), the gate of transistor MP300 at node N300 is drawn to the circuit ground potential (GND).

The active load transistors (MP33 and MN43) are operated in their sub-threshold operating region. To accomplish sub-threshold operation, the ratio between the sizes of the diode connected devices (MP32 and MN42) and the active load transistors (MP33 and MN43) are arranged appropriately. In one exemplary embodiment, the ratio of the sizes of MP33 and MP32 is roughly two to one, with MP32 having a channel width that is half of the channel width of transistor MP33. Other ratios may also be used to ensure that the active load transistors (MP32 and MN42) are biased in sub-threshold operation.

It has been determined that MOS transistors exhibit the following current/voltage relationship in sub-threshold operation:

$$ID\_SUBVT = ISAT \times e^{VG/n \cdot VT} \times (e^{VS/VT} - e^{-VD/VT}),$$

where

ISAT is the saturation current that is proportional to the area of the MOS device, VG is the gate voltage, VS is the source voltage, VD is the drain voltage, n is a constant (usually between 1 and 2 for MOS), and VT is the thermal voltage given by kT/q.

At nominal temperatures, VT is roughly 26 mV. Assuming n=2, the gate voltage changes at roughly 120 mV for every decade change in current. The saturation current is related to the channel resistance as a multiple of kT/q (e.g., Ron≈26 mV/Idsat).

In one example, the size of transistor MN43 is twice the size of transistor MN42. When the input signal at node OUTAB is at the same potential as node N34 (the voltage reference signal), MP40 and MP41 steer equal amounts of current to transistors MN42 and MN43 (via MN44). Half of the current (IT4) in the differential pair flows into transistor MN42 and the other half of the current flows into transistor MN43. Since transistor MN43 is twice the size of transistor MN42, transistor MN43 is operating as a resistor in the sub-threshold saturated region. The voltage across transistor MN43 is defined by kT/q in accordance with the relationships described above. Thus, transistor MN43 operates as a resistor that biases transistor MN400 for class AB operation. Similarly, transistor MP33 operates as a resistor that biases transistor MP300 for class AB operation. Transistors MN400 and MP300 never completely shut off and always conduct a small amount of standby current. The small standby current reduces transient delays in turning on the respective output transistors when the output signal swings rail-to-rail.

An external load is connected to the OUT node of the output stage amplifier (300). The external load may be capacitive or resistive. The characteristics of the load, and the desired slew rate performance will dictate the amount of current that the load requires for full swing operation. Thus, the sizes of transistors MP300 and MN400 are determined based on the desired maximum load characteristics of the output stage amplifier (300).

Transistors MN44 and MP34 are configured as diodes that also operate as sub-threshold devices. Transistors MP300 and MP34 are sized in a ratio between one another, where MP34 is smaller in area than MP300. Similarly, transistor MN400 and MN44 are sized in a ratio between one another, where MN44 is smaller in area than MN400. The sizes of the diode connected devices (MP34, MN44) and the active load transistors (MP33, MN43) will determine the amount of AB bias that is provided to the output drive transistors (MP300, MN400). By scaling the area of the diode devices, the ISAT term in the sub-threshold equations are also scaled. Area scaling the diode device results in a change in the ISAT term similar to the thermal voltage (kT/q)*n. For example, a 120 mV increase (n*kT/q=120 mV) in gate voltage results in a ten-fold (decade) increase in drain current in the diode-connected device. When a diode-connected device is area scaled, the area scaling has the same effect as an increase in the thermal voltage.

The output stage amplifier (300) does not require a high power supply voltage for proper operation. Since the output stage amplifier (300) is a class AB output stage, with a single PMOS transistor (MP300) and a single NMOS transistor (MN400) providing the output signal, the minimum supply voltage is roughly a single threshold voltage. The output stage amplifier (300) has stable operation with a single compensation device. Capacitor C6 provides a stable compensation by coupling high frequency signals between the input node (OUTAB) of the output stage amplifier (300) and the output node (OUT).

Figure 4:
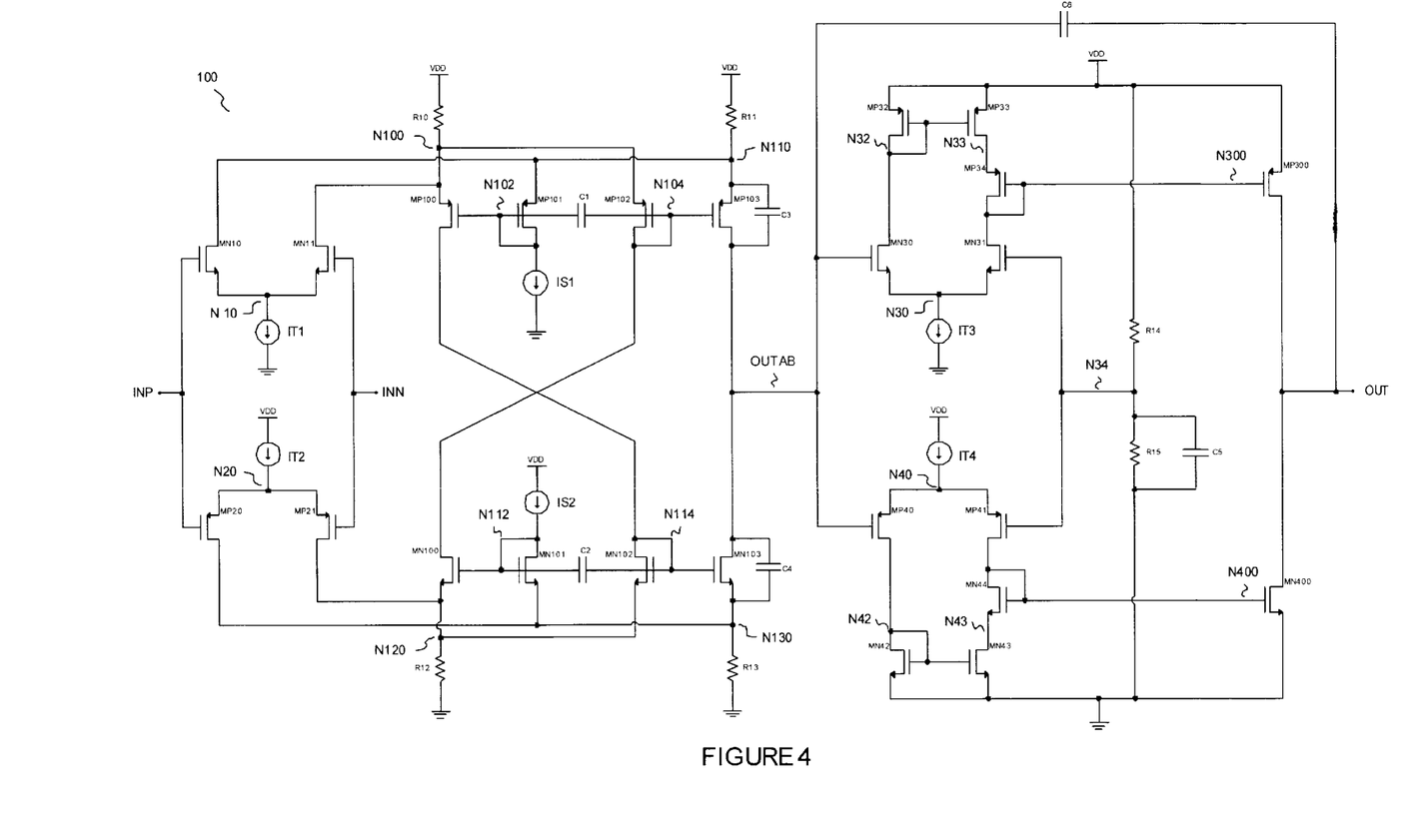
FIG. 4 is a complete schematic diagram of an exemplary amplifier system in accordance with the present invention.

FIG. 4 illustrates an example of a complete amplifier (400) in accordance with the present invention. The amplifier shown in FIG. 4 includes the input amplifier stage (200) from FIG. 2, and the output amplifier stage (300) from FIG. 3. The input stages of the input amplifier provide a first gain stage in the amplifier. The AB turnaround stage provides another stage of gain. The level shifters (output drivers) provide yet another gain stage. The output transistors (MP300, MN300) provide yet another gain stage. Thus, the system includes four gain stages. Nominal systems designed in accordance with the present invention will have gains in excess of 100 dB, while operating at low supply voltages. Also, the minimum operating voltage for rail-to-rail operation is determined by the minimum operating voltages for the NMOS input stage (MN10, MN11) and the minimum operating voltages for the PMOS input stage (MP20, MP21). For example, designs that include a low threshold process with 0.5V thresholds operate at a minimum power supply voltage of 1V. As subsequent improvements are made in semiconductor processing, lower supply voltages may be possible using the same topology.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus, operating from a high power supply having a high potential and a low power supply having a low potential, that is arranged to provide a rail-to rail output signal at an output node in response to an input signal at an input node, comprising:
   a first active load device, that operates as a sub-threshold device, is coupled to the high power supply and a first intermediary node;
   a first diode device is coupled between the first intermediary node and a first drive node, wherein the first diode device is arranged to provide a high drive signal at the first drive node when active and the first diode device is inactive when the input signal is at the low potential;
   a first MOS transistor, wherein the gate of the first MOS transistor is coupled to a reference voltage, the drain of the first MOS transistor is coupled to the first drive node, and the source of the first MOS transistor is coupled to a first current source, wherein the first MOS transistor is arranged to couple the first drive node to the low potential when the first diode device is inactive;
   a second active load device, tat operates as a sub-threshold device, is coupled to the low power supply and a second intermediary node;
   a second diode device is coupled between the second intermediary node and a second drive node, wherein the diode device is arranged to provide a low drive signal at the second drive node when active and the second diode device is inactive when the input signal is at the high potential;
   a second MOS transistor, wherein the gate of the second MOS transistor is coupled to the reference voltage, the drain of the second MOS transistor is coupled to the second drive node, and the source of the second MOS transistor is coupled to a second current source, wherein the second MOS transistor is arranged to couple the second drive node to the high potential when the second diode device is inactive; and
   a class AB output drive circuit is arranged to provide the rail-to-rail output signal in response to the high drive signal and the low drive signal, wherein the class AB output drive circuit is biased for class AB operation.

2. An apparatus as in claim 1, further comprising a reference circuit that arranged to produce the reference voltage at a reference node in response to the high potential and the low potential, wherein the reference voltage is substantially half-way between the high potential and the low potential.

3. An apparatus as in claim 1, the class AB output drive circuit further comprising:
   a first MOS output transistor, wherein the gate of the first MOS output transistor is coupled to the first drive node such that the first diode device provides a class AB bias to the first MOS output transistor at the first drive node; and
   a second MOS output transistor, wherein the gate of the second MOS output transistor is coupled to the second drive node such that the second diode device provides another class AB bias to the second MOS output transistor at the second drive node.

4. An apparatus as in claim 1, further comprising a compensation circuit is coupled between the output node and the input node.

5. An apparatus as in claim 1, further comprising a
   a third active load device, that operates as a sub-threshold device, is coupled to the high power supply and a third intermediary node, wherein the third active load device and the first active load device are arranged as a first current reflection circuit;
   a third MOS transistor, wherein the gate of the third MOS transistor is coupled to the input signal, the drain of the third MOS transistor is coupled to the third intermediary node, and the source of the third MOS transistor is coupled to the first current source, such that the first MOS transistor and the third MOS transistor operate as a first differential pair in a first transconductance amplifier circuit;
   a fourth active load device, that operates as a sub-threshold device, is coupled to the low power supply and a fourth intermediary node, wherein the fourth active load device and the second active load device are arranged as a second current reflection circuit; and
   a fourth MOS transistor, wherein the gate of the fourth MOS transistor is coupled to the input signal, the drain of the fourth MOS transistor is coupled to the fourth intermediary, and a source of the fourth MOS transistor is coupled to the second current source, such that the second MOS transistor and the fourth MOS transistor operate as a second differential pair in a second transconductance amplifier circuit.

6. An apparatus as in claim 5, wherein the first transconductance amplifier circuit provides a first level shifted signal that is coupled to the first drive node, and the second transconductance amplifier circuit provides a second level shifted signal that is coupled to the second drive node such that the first level shifted signal and the second level shifted signal provide class AB biasing to the class AB output drive circuit.

7. An apparatus as in claim 5, wherein the first transconductance amplifier provides a gain from the input signal to the first drive node, and the second transconductance amplifier provides another gain from the input signal to the second drive node.

8. An apparatus as in claim 5, wherein the first active load device has a first associated area, the second active load device has a second associated area, the third active load device has a third associated area, the fourth active load device has a fourth associated area, the first associated area ratios to the third associated area by a first ratio, and the second associated area ratios to the fourth associated area by a second ratio.

9. An apparatus as in claim 8, wherein the first ratio and the second ratio are substantially two-to-one.

10. An apparatus, operating from a high power supply having a high potential and a low power supply having a low potential, that is arranged to provide a rail-to-rail output signal at an output node in response to a differential input signal, comprising:
   an input stage amplifier circuit that produces a single-ended signal from the differential input signal; and
   an output stage amplifier circuit that produces the rail-to-rail output signal in response to the single-ended input signal, the output stage amplifier circuit comprising:
      a first active load device, that operates as a sub-tbreshold device, is coupled to the high power supply and a first intermediary node;

a first diode device is coupled between the first intermediary node and a first drive node, wherein the first diode device is arranged to provide a high drive signal at the first drive node when active aid the first diode device is inactive when the single-ended input signal is at the low potential;

a first MOS transistor, wherein the gate of the first MOS transistor is coupled to the reference circuit, the drain of the first MOS transistor is coupled to the first drive node, and the source of the first MOS transistor is coupled to a first current source, wherein the first MOS transistor is arranged to couple the first drive node to the low potential when the first diode device is inactive;

a second active load device, that operates as a sub-threshold device, is coupled to the low power supply and a second intermediary node;

a second diode device is coupled between the second intermediary node and a second drive node, wherein the diode device is arranged to provide a low drive signal at the second drive node when active and the second diode device is inactive when the single-ended input signal is at the high potential;

a second MOS transistor, wherein the gate of the second MOS transistor is coupled to the reference circuit, the drain of the second MOS transistor is coupled to the second drive node, and the source of the second MOS transistor is coupled to a second current source, wherein the second MOS transistor is arranged to couple the second drive node to the high potential when the second diode device is inactive; and a class AB output drive circuit is arranged to provide the rail-to-rail output signal in response to the high drive signal and the low drive signal, wherein the class AB output drive circuit is biased for class AB operation.

11. An apparatus as in claim 10, the input stage amplifier circuit further comprising:

a first transconductance amplifier that includes an NMOS differential pair of transistors that are arranged to provide a first current output at a first node and a second current output at a second node, wherein the first and second current outputs are produced in response to the differential input signal and the NMOS differential pair of transistors are arranged to operate as sub-threshold devices;

a second transconductance amplifier that includes a PMOS differential pair of transistors that are arranged to provide a third current output at a third node and fourth current output at a fourth node, wherein the third and fourth current outputs are produced in response to the differential input signal and the PMOS differential pair of transistors are arranged to operate as sub-threshold devices; and a class AB turnaround stage circuit produces the single-ended signal in response to the first, second, third, and fourth current outputs.

12. An apparatus as in claim 11, the class AB output drive circuit of the output stage amplifier circuit further comprising:

a first MOS output transistor, wherein the gate of the first MOS output transistor is coupled to the first drive node such that the first diode device provides a class AB bias to the first MOS output transistor at the first drive node; and a second MOS output transistor, wherein the gate of the second MOS output transistor is coupled to the second drive node such that the second diode device provides another class AB bias to the second MOS output transistor at the second drive node.

13. An apparatus as in claim 12, the output stage amplifier circuit further comprising:

a third active load device, that operates as a sub-threshold device, is coupled to the high power supply and a third intermediary node, wherein the third active load device and the first active load device are arranged as a first current reflection circuit;

a third MOS transistor, wherein the gate of the third MOS transistor is coupled to the input signal, the drain of the third MOS transistor is coupled to the third intermediary node, and the source of the third MOS transistor is coupled to the first current source, such that the first MOS transistor and the third MOS transistor operate as a first differential pair in a first transconductance amplifier circuit;

a fourth active load device, that operates as a sub-threshold device, is coupled to the low power supply and a fourth intermediary node, wherein the fourth active load device and the second active load device are arranged as a second current reflection circuit; and a fourth MOS transistor, wherein the gate of the fourth MOS transistor is coupled to the input signal, the drain of the fourth MOS transistor is coupled to the fourth intermediary, and a source of the fourth MOS transistor is coupled to the second current source, such that the second MOS transistor and the fourth MOS transistor operate as a second differential pair in a second transconductance amplifier circuit.

14. An apparatus as in claim 11, the class AB turnaround stage of the input stage amplifier circuit further comprising:

a first resistance circuit that is coupled between the first node and the high power supply;

a second resistance circuit that is coupled between the second node and the high power supply;

a third resistance circuit that is coupled between the third node and the low power supply;

a fourth resistance circuit that is coupled between the fourth node and the low power supply;

a first and second PMOS transistor, wherein the source of the first PMOS transistor is coupled to the first node, the source of the second PMOS transistor is coupled to the third node, the gate of the first PMOS transistor is coupled to the gate of the second PMOS transistor, and the drain of the second PMOS transistor is coupled to a third current source;

a first and second NMOS transistor, wherein the source of the first NMOS transistor is coupled to the third node, the source of the second NMOS transistor is coupled to the fourth node, the gate of the first NMOS transistor is coupled to the gate of the second NMOS transistor, and the drain of the second NMOS transistor is arranged to provide a current in response to a fourth current source;

a third and fourth PMOS transistor, wherein the source of the third PMOS transistor is coupled to the first node, the source of the fourth PMOS transistor is coupled to the second node, the gate of the third PMOS transistor is coupled to the gate of the fourth PMOS transistor, the drain of the third PMOS transistor is coupled to the drain of the first NMOS transistor; and a third and fourth NMOS transistor, wherein the source of the third NMOS transistor is coupled to the third node, the source of the fourth NMOS transistor is coupled to the fourth node, the gate of the third NMOS transistor is coupled to the gate of the fourth NMOS transistor, the drain of the third NMOS transistor is coupled to the drain of the first PMOS transistor, and the drain of the fourth PMOS transistor is coupled to the drain of the fourth NMOS transistor at a common node, wherein the single-ended signal corresponds to a potential of the common-node.

15. An apparatus as in claim 14, wherein the gate of the first NMOS transistor is coupled to the gate of the fourth NMOS transistor through a first compensation circuit, and the gate of the first PMOS transistor is coupled to the gate of the fourth PMOS transistor through a second compensation circuit, wherein the first and second compensation circuits enhance stability in the input stage amplifier.

16. An apparatus as in claim 14, wherein a first compensation circuit is coupled between the source and drain of the fourth NMOS transistor and a second compensation circuit is coupled between the source and the drain of the fourth PMOS transistor, wherein the first and second compensation circuits enhance stability in the input stage amplifier.

17. An apparatus, operating from a high power supply having a high potential and a low power supply having a low potential, that is arranged to provide a rail-to-rail output signal at an output node in response to an input signal at an input node, comprising:
 a first means for level shifting that produces a first drive signal that corresponds to a first level shifted version of the input signal, the first means for level shifting providing gain between the input signal and the first drive signal, and the first means for level shifting is arranged to couple the first drive signal to the low potential when the potential of the input signal corresponds to the low potential;
 a second means for level shifting that produces a second drive signal that corresponds to a second level shifted version of the input signal, the second means for level shifting providing gain between the input signal and the second drive signal, and the second means for level shifting is arranged to couple the second drive signal to the high potential when the potential of the input signal corresponds to the high potential;
 a first output drive means is coupled to the output node, wherein the first output drive means is responsive to the first drive signal; and
 a second output drive means is coupled to the output node, wherein the second output drive means is responsive to the second drive signal, the first output drive means is arranged to cooperate with the second output drive means such that the first output drive means and the second output drive means provide the rail-to-rail output signal at the output node.

18. An apparatus, as in claim 17, further comprising a means for converting that is arranged to produce a single-ended signal in response to a rail-to-rail differential input signal, wherein the single-ended signal corresponds to the input signal.

19. An apparatus as in claim 18, the means for converting further comprising:
 a first means for generating that produces a first and a second current in response to the rail-to-rail differential input signal, wherein the first means for generating operates with common-mode signals that range up to the high potential;
 a second means for generating that produces a third and fourth current in response to the differential signal, wherein the second means for generating operates over common-mode signals that range down to the low potential;
 a first means for converting is arranged to convert the first current and the second current into a first signal;
 a second means for converting is arranged to convert the third current and the fourth current into a second signal; and
 a means for combining is arranged to produce the single-ended signal in response to the first signal and the second signal.

20. An apparatus, operating from a high power supply having a high potential and a low power supply having a low potential, that is arranged to provide a rail-to-rail output signal at an output node in response to an input signal at au input node, comprising:
 a first MOS transistor, wherein the source of the first MOS transistor is coupled to the high power supply, the drain of the first MOS transistor is coupled to a first node, and the gate of the first MOS transistor is coupled to a third node;
 a second MOS transistor, wherein the source of the second transistor is coupled to the first node, and the gate and source of the second MOS transistor are coupled to a second node;
 a third MOS transistor, wherein the drain of the third MOS transistor is coupled to the second node, the source of the third MOS transistor is coupled to a first current source, and the gate of the third MOS transistor is arranged to receive a reference voltage;
 a fourth MOS transistor, wherein the source of the fourth MOS transistor is coupled to the high power supply, and the gate and drain of the fourth MOS transistor are coupled to the third node;
 a fifth MOS transistor, wherein the drain of the fifth MOS transistor is coupled to the third node, the source of the fifth MOS transistor is coupled to the first current source, and the gate of the fifth MOS transistor is arranged to receive the input signal;
 a sixth MOS transistor, wherein the source of the first MOS transistor is coupled to the low power supply, the drain of the sixth MOS transistor is coupled to a fourth node, and the gate of the sixth MOS transistor is coupled to a sixth node;
 a seventh MOS transistor, wherein the source of the seventh transistor is coupled to the fourth node, the gate and source of the second MOS transistor are coupled to a fifth node;
 an eighth MOS transistor, wherein the drain of the eighth MOS transistor is coupled to the f node, the source of the eighth MOS transistor is coupled to a second current source, and the gate of the eighth MOS transistor is arranged to receive the reference voltage;
 a ninth MOS transistor, wherein the source of the ninth MOS transistor is coupled to the low power supply, the gate and dram of the ninth MOS transistor are coupled to the sixth node;
 a tenth MOS transistor, wherein the drain of the tenth MOS transistor is coupled to the sixth node, the source of the tenth-MOS transistor is coupled to the second current source, and the gate of the tenth MOS transistor is arranged to receive the input signal.

21. An apparatus as in claim 20, wherein the first MOS transistor, the second MOS transistor, the fourth MOS transistor, the eighth MOS transistor and the tenth MOS transistor are PMOS transistors; and the third MOS transistor, the fifth MOS transistor, the sixth MOS transistor, the seventh MOS transistor and the ninth MOS transistor are NMOS transistors.

* * * * *

UNITED STATES PATENT AND TRADEMARK OFFICE
CERTIFICATE OF CORRECTION

PATENT NO. : 6,433,637 B1
DATED : August 13, 2002
INVENTOR(S) : Sauer

It is certified that error appears in the above-identified patent and that said Letters Patent is hereby corrected as shown below:

Column 13,
Line 29, "tat" should read -- that --
Line 51, "circuit that arranged to" should read -- circuit that is arranged to --

Column 14,
Line 2, "comprising a compensation circuit is coupled" should read -- comprising a compensation circuit that is coupled --

Column 18,
Line 12, "au" should read -- an --
Line 46, "f" should read -- fifth --
Line 52, "dram" should read -- drain --

Signed and Sealed this

Seventh Day of January, 2003

JAMES E. ROGAN
*Director of the United States Patent and Trademark Office*